(12) United States Patent
Aoyagi

(10) Patent No.: US 10,452,358 B2
(45) Date of Patent: Oct. 22, 2019

(54) RANDOM NUMBER GENERATING APPARATUS

(71) Applicant: CANON KABUSHIKI KAISHA, Tokyo (JP)

(72) Inventor: Takeshi Aoyagi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/866,237

(22) Filed: Jan. 9, 2018

(65) Prior Publication Data

US 2018/0196641 A1     Jul. 12, 2018

(30) Foreign Application Priority Data

Jan. 11, 2017  (JP) ................................ 2017-002512

(51) Int. Cl.
| | | |
|---|---|---|
| G06F 7/58 | (2006.01) |
| H03K 19/21 | (2006.01) |
| H03K 3/84 | (2006.01) |
| H03K 3/03 | (2006.01) |

(52) U.S. Cl.
CPC ........... *G06F 7/588* (2013.01); *H03K 3/0315* (2013.01); *H03K 3/84* (2013.01); *H03K 19/21* (2013.01)

(58) Field of Classification Search
CPC ................................................ G06F 7/58–588
USPC ................................................ 708/250–256
See application file for complete search history.

(56) References Cited

U.S. PATENT DOCUMENTS

| | | | | |
|---|---|---|---|---|
| 4,799,259 A | * | 1/1989 | Ogrodski | H03K 3/84 |
| | | | | 331/78 |
| 9,361,066 B2 | * | 6/2016 | Rooks | G06F 7/588 |
| 2006/0069706 A1 | * | 3/2006 | Lazich | G06F 7/588 |
| | | | | 708/251 |
| 2009/0222502 A1 | * | 9/2009 | Ikegami | G06F 7/588 |
| | | | | 708/251 |

(Continued)

FOREIGN PATENT DOCUMENTS

JP      2001184255 A     7/2001

OTHER PUBLICATIONS

G. Edward Suh and Srinivas Devadas, "Physical unclonable functions for device authentication and secret key generation", In Proceedings of the 44th Design Automation Conference, pp. 9-14, 2007 (Year: 2007).*

(Continued)

*Primary Examiner* — Matthew D Sandifer
(74) *Attorney, Agent, or Firm* — Canon U.S.A., Inc. IP Division

(57) ABSTRACT

A random, number generating apparatus includes a first ring oscillator and a second ring oscillator, each having a quantity of delay elements different from, the other, a signal output unit, a selecting unit, a logic circuit, and a random signal output unit. The signal output unit receives a first signal output from the first ring oscillator and a second signal output from, the second ring oscillator and outputs the first signal or the second signal. The selecting unit selects a signal to be output from the signal output unit. The logic circuit receives the signal selected by the selecting unit and the output from the signal output unit and outputs an output signal. The random signal output unit receives the output signal output from the logic circuit and a clock signal and outputs a random signal.

22 Claims, 17 Drawing Sheets

(56) References Cited

U.S. PATENT DOCUMENTS

| | | | | |
|---|---|---|---|---|
| 2014/0191813 A1* | 7/2014 | Sul | ............................ | G06F 7/58 331/46 |
| 2015/0106415 A1* | 4/2015 | Mei | ......................... | H03K 3/84 708/251 |
| 2016/0277025 A1* | 9/2016 | Tanamoto | ................ | G06F 7/588 |

OTHER PUBLICATIONS

F. Kodýtek, R. Lórencz, and J. Buček, "Improved ring oscillator PUF on FPGA and its properties", Microprocessors and Microsystems, 2016 (Year: 2016).*

F. Kodýtek and R. Lórencz, "A Design of Ring Oscillator Based PUF on FPGA", 2015 IEEE 18th International Symposium on Design and Diagnostics of Electronic Circuits & Systems (DDECS), pp. 37-42, 2015 (Year: 2015).*

M. Yoshinaga, H. Awano, M. Hiromoto and T. Sato, "Physically unclonable function using RTN-induced delay fluctuation in ring oscillators," 2016 IEEE International Symposium on Circuits and Systems (ISCAS), pp. 2619-2622, 2016 (Year: 2016).*

M. Patterson, J. Zambreno, C. Sabotta, S. Vyas, and A. Mills, "Ring Oscillator PUF Design and Results", 2011 (Year: 2011).*

* cited by examiner

FIG. 5

| A | B | C | Q |
|---|---|---|---|
| 0 | 0 | 0 | 0 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 1 |

FIG. 7

| A | B | C | Q |
|---|---|---|---|
| 0 | 0 | 0 | 0 |
| 0 | 0 | 1 | 1 |
| 1 | 0 | 0 | 1 |
| 1 | 0 | 1 | 0 |

FIG. 9

| A | B | C | Q |
|---|---|---|---|
| 0 | 0 | 0 | 0 |
| 0 | 1 | 0 | 1 |
| 1 | 0 | 0 | 1 |
| 1 | 1 | 0 | 0 |

FIG. 11

| A | B | C | Q |
|---|---|---|---|
| 0 | 0 | 0 | 0 |
| 0 | 0 | 1 | 1 |
| 0 | 1 | 0 | 1 |
| 0 | 1 | 1 | 0 |

FIG. 14

| CLK_Sel[1] | CLK_Sel[0] | CLK_OUT |
|---|---|---|
| 0 | 0 | CLK_A |
| 0 | 1 | CLK_A_INV |
| 1 | 0 | CLK_B |
| 1 | 1 | CLK_B_INV | ions # RANDOM NUMBER GENERATING APPARATUS

BACKGROUND OF THE INVENTION

Field of the Invention

The present disclosure relates to a random number generating apparatus,

Description of the Related Art

Use of random, numbers is essential in the information security field. In recent years, a high-performance random number generating apparatus has been highly demanded which can generate true random numbers having uniformity (without differences in probability values and incidences of random numbers) while without regularity of incidence, correlation and periodicity of the numbers.

A generally known random number generating apparatus applies high-speed operating clocks output from a ring oscillator and has the following configuration.

The high-speed operating clocks output from the ring oscillator are connected to a data input terminal of a flip-flop circuit (hereinafter, an FF). Clocks which are asynchronous with the clocks output from the ring oscillator and which have a low frequency and contain a large jitter component are connected to a clock terminal of the FF to operate the FF.

Thus, due to influence of a jitter component of the high-speed clocks from the ring oscillator and a jitter component of low-speed clocks input for synchronization of the FF, random numbers are generated from the output from the FF.

A technology has been proposed which may XOR outputs from a plurality of ring oscillators and thus increase the number of times of toggling of signals to be input to a data input terminal of an FF or may provide a plurality of ring oscillators having different delay times and thus select the cycle or jitter value of clocks to be generated so that a configuration with high randomness can be selected (as in Japanese Patent Laid-Open No. 2001-184255).

SUMMARY OF THE INVENTION

However, in a case where it is found out that supposed randomness cannot be obtained from a random number generating apparatus integrated in a chip for data processing such as an ASIC after the chip is manufactured, the circuit may not be changed. This may require re-designing of the chip for reconstruction.

The disclosed random number generating apparatus provides a high randomness in which a combination of frequencies of clocks to be input to a logic circuit is dynamically changed to select the cycle or jitter value of clocks to be generated.

A random number generating apparatus includes a first ring oscillator having a plurality of delay elements, a second ring oscillator having a plurality of delay elements, wherein the number of the delay elements in the first ring oscillator and the number of the delay elements in the second ring oscillator are different, a signal output unit configured to receive a first signal output from the first ring oscillator and a second signal output from the second ring oscillator and to output the first signal or the second signal, a selecting unit configured to select a signal to be output from the signal output unit among the first signal and the second signal, a logic circuit configured to receive the signal selected by the selecting unit and to output an output signal, and a random signal output unit configured to receive the output signal output from the logic circuit and a clock signal and to output a random signal.

Further features of the present invention will become apparent from the following description of embodiments with reference to the attached drawings.

BRIEF DESCRIPTION OF THE DRAWINGS

FIG. 5 is a truth table illustrating operations of a three-input XOR circuit.

FIG. 7 is a truth table illustrating operations to be performed by a high-speed clock, generating unit.

FIG. 9 is a truth table illustrating operations to be performed by the three-input XOR circuit.

FIG. 11 is a truth table illustrating operations to be performed by the three-input XOR circuit.

FIG. 14 illustrates input/output clock states of the circuit illustrated in FIG. 13.

DESCRIPTION OF THE EMBODIMENTS

Description of System Configuration
First Embodiment

Figure 1:
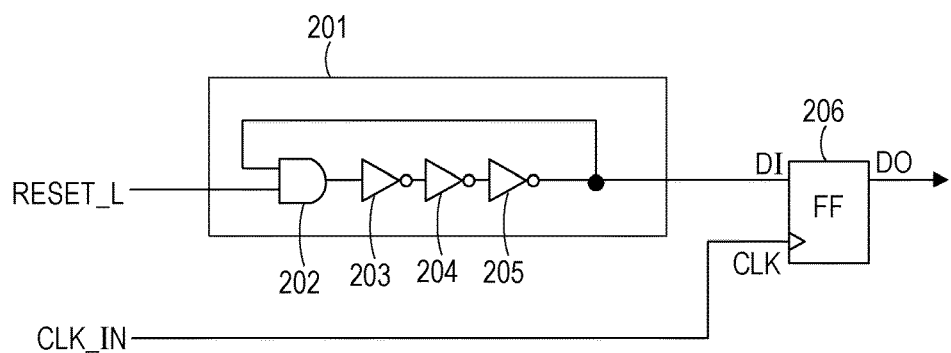
FIG. 1 illustrates a fundamental configuration of a random number generating apparatus.

FIG. 1 illustrates a fundamental configuration of a random number generating apparatus employing a ring oscillator to be applied in an integrated circuit. Here, the integrated circuit may be an application-specific integrated circuit (ASIC).

Referring to FIG. 1, a ring oscillator unit 201 is connected to an odd-number of inverters in a ring-shape for generating high-speed clocks to be used for random-number generation. According to a first embodiment, three inverters 203, 204, and 205 are serially connected. In a case where a RESET_L signal fixed to "Low" (hereinafter "L") is input to an AND circuit 202 in the ring oscillator unit 201, the ring oscillator unit 201 outputs a signal fixed to "L" through the AND circuit 202. Thus, a data input terminal (DI) of a triggered FF 206 keeps a signal at "High" (hereinafter, "H"). The signal at "H" is also input to an input terminal of the AND circuit 202 connected to the data input terminal (DI) of the triggered FF 206.

When the RESET_L signal input to the AND circuit 202 in the ring oscillator unit 201 is changed to "H", a signal to be input to the inverter 203 is changed from "L" to "H". Then, the output signal from the inverter 203 is changed from "H" to "L", the output signal from the inverter 204 is changed from "L" to "H", and the output signal from the inverter 205 is changed from "H" to "L".

Then, the signal to the data input terminal (DI) in the triggered FF 206 is changed from "H" to "L".

The signal to the input terminal in the AND circuit 202 connected to the data input terminal (DI) in the triggered FF 206 is also changed from "H" to "L", Thus, the output signal from the inverter 203 is changed from "L" to "H", the output signal from the inverter 204 is changed from "H" to "L", and the output signal from the inverter 205 is changed from "L" to "H". Then, the signal to be input to the data input terminal (DI) of the triggered FF 206 is also changed from "L" to "H".

After a lapse of a delay time for the signal to pass through the inverters and a lapse of a delay time in wiring connecting the inverters, the repetitions of the inversions of the logic are extracted from, the output signal from the inverter 205, and the resulting signal is input to the data input terminal (DI) in the triggered FF 206.

A low speed, clock (CLK_IN) having a lower frequency than a high-speed clock output from the ring oscillator is input to a clock input terminal (CLK) of the triggered FF 206.

The high-speed clock is triggered by the low-speed clock in the triggered FF 206, and the resulting signal is output to a data output terminal (DO). Random numbers for required bits are generated based on random, changes to "H" or "L" of the output of the triggered FF 206.

Figure 2:
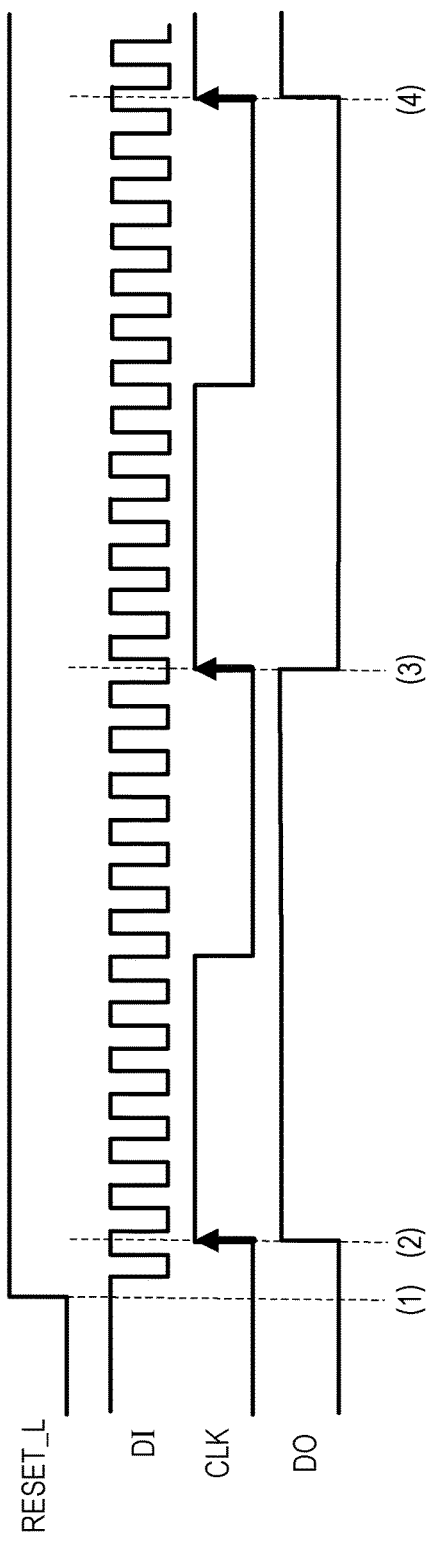
FIG. 2 illustrates waveforms of operating signals from a random number generating apparatus.

FIG. 2 illustrates waveforms when signals from the random number generating apparatus in FIG. 1 operate.

Referring to FIG. 2, when the RESET_L signal is changed to "H", the ring oscillator 201 starts outputting high-speed clocks (time point (1) in FIG. 2).

In a case where the relationship as illustrated in FIG. 2 is satisfied between the cycle of high-speed clocks and the cycle of low-speed clocks, the low-speed clock input to the clock input terminal (CLK) in the triggered FF 206 rises at a time point (2). The rising edge triggers the high-speed clock to be output so that the signal output from the output terminal (DO) is changed from "L" to "H".

Also, at a time point (3), the rising edge of the low-speed clock input to the CLK triggers the high-speed clock to be output, and the signal output from the output terminal (DO) is changed from "H" to "L". At a time point (4), the signal output from, the output terminal. (DO) is changed from "L" to "H" again.

In a case where the cycles of the high-speed clocks and the low-speed clocks are uniform as illustrated in FIG. 2, random numbers are not generated without consideration of jitter in clocks. However, the high-speed clocks may, in reality, have jitter caused by variations in operation of the inverters and changes in ambient temperature and operating voltage.

The low-speed clocks may have jitter in operation of a phase-locked loop (PLL) which is configured to generate low-speed clocks. When frequency division is performed for changing the clock, output from the PLL to a low-speed clock, jitter occurring in the PLL is propagated as larger jitter.

Figure 3:
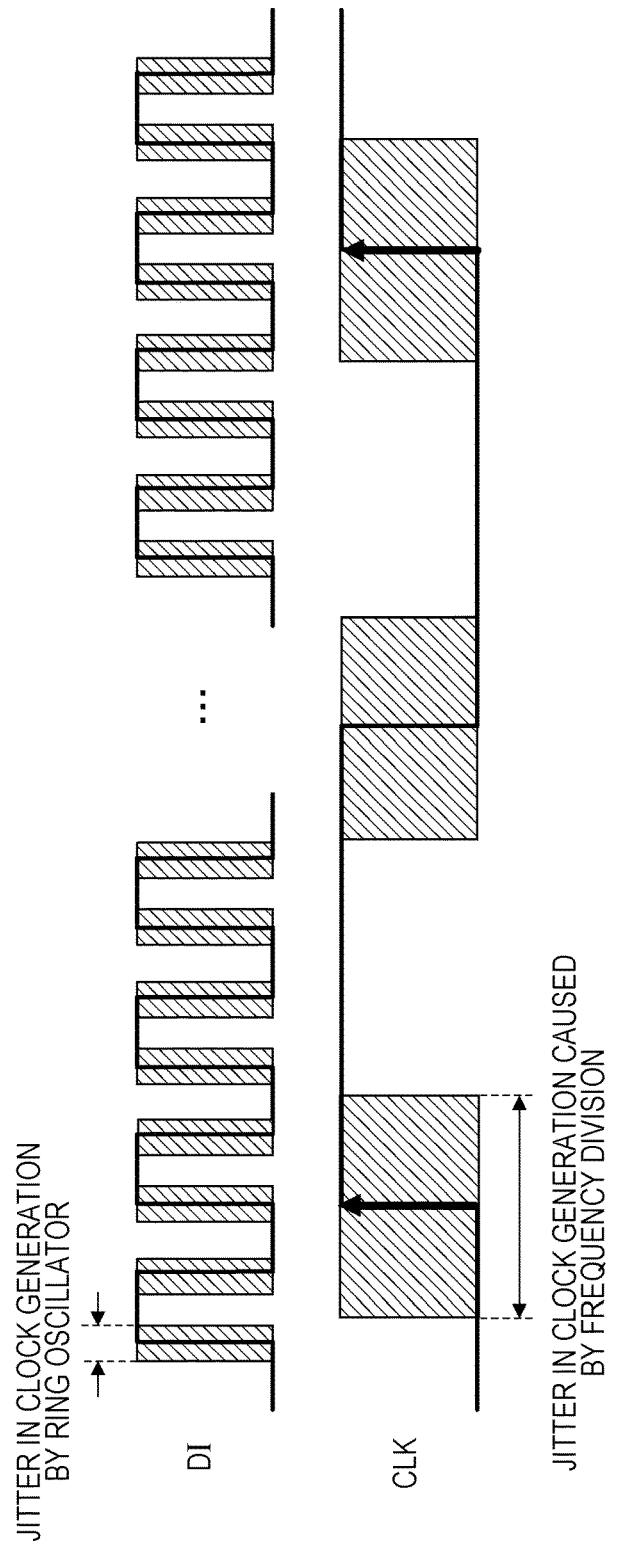
FIG. 3 illustrates a mechanism for generating random, numbers.

FIG. 3 illustrates a mechanism for generating random numbers in consideration of jitter in clocks.

Referring to FIG. 3, high-speed clocks generated by the ring oscillator 201 have jitter under influences of variations in processes, operating voltages, ambient-temperatures and so on upon manufacturing of the inverters 203, 204, and 205, and the AND circuit 202. This may cause the waveform DI in FIG. 3 to have jitter indicated as shaded parts, and it is difficult to determine where a rising edge and a falling edge occur in the shaded parts.

The low-speed clocks are generated originally by performing frequency division on clocks having a high frequency generated by a PLL, for example.

In general, when the frequency of the clocks is divided into N equal parts, the jitter is increased N times or root N times. When clocks at 1000 MHz output from a PLL has jitter of 0.25 nanosecond (nsec), the clocks at 40 MHz divided into 25 equal parts have jitter from 5 times to 25 times.

In other words, clocks at 40 MHz or having a cycle of 25 nsec contain jitter from 1.25 nsec to 6.25 nsec.

Like the case of the high-speed clocks, where a rising edge and a falling edge occurs are not determined within a range of jitter of the low-speed clocks.

Therefore, referring to FIG. 3, when high-speed clocks have a frequency of 1 GHz, the high-speed clocks has a cycle of 1 nsec. When low-speed clocks have jitter of 1.25 nsec to 6.25 nsec larger than the cycle of the high-speed clocks, it may not be determined which of "H" and "L" of the high-speed clocks is to be triggered by the rising edge of the low-speed clocks to be used in the triggered FF 206. In other words, random "H" and "L" are output from the DO. The generation of random numbers by using the ring oscillator and the triggered FF has been described up to this point.

Jitter of clocks output from the ring oscillator or a jitter value as a result of frequency division performed on the clocks may be increased by a significant change in temperature of a chip or in voltage therein. However, in reality, the operating voltage and the ambient temperature do not change significantly while the chip is being used.

Therefore, there is a possibility that expected randomness may not be obtained from the random number generating apparatus actually operating in the chip such as an ASIC manufactured to have a conventional circuit configuration.

In a case where a chip is used which needs re-configuration of a circuit of an FPGA, for example, the number of inverter cells may be changed or the frequency of clocks to be input to an FF, the length of wiring therefor, or the number of clock buffers may be changed for the re-configuration of the circuit and thus for adjustment for higher randomness. However, in a case where it is difficult to change the circuit configuration of, for example, a manufactured ASIC, re-manufacturing of the ASIC may be required, resulting in an increase of the development period with high costs. Therefore, such an ASIC may be required to have a configuration which can provide randomness as high as possible in an environment in which the ASIC is to be used after the ASIC is manufactured as in the following embodiments.

Figure 4:
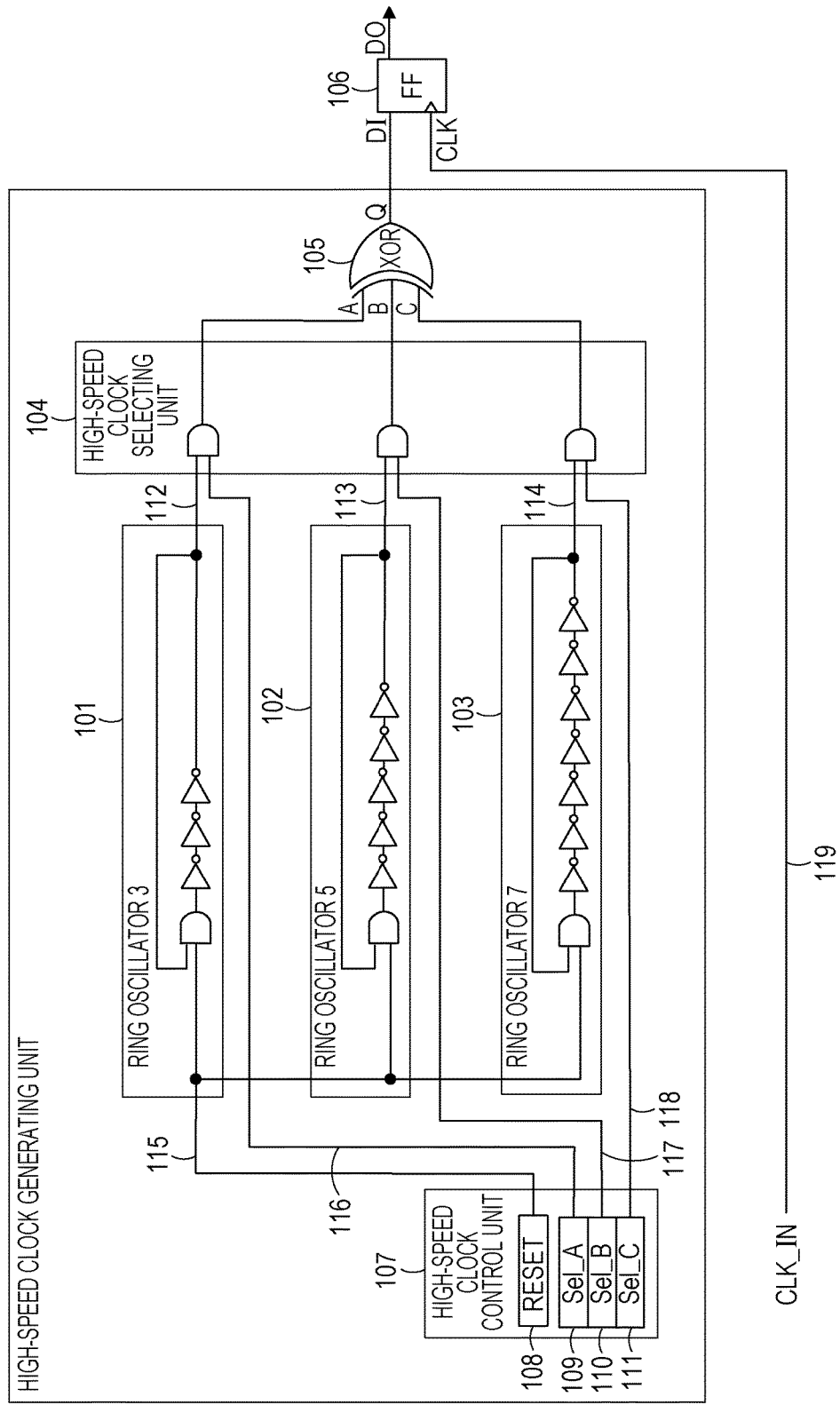
FIG. 4 is a block diagram illustrating a random number generating apparatus.

FIG. 4 is a block diagram illustrating a random number generating apparatus (100) according to this embodiment. This embodiment applies a random number generating apparatus having 3-, 5-, and 7-step ring oscillators.

FIG. 4 illustrates a ring oscillator 101 for generating high-speed clocks 112 is configured as a ring oscillator using three inverters according to this embodiment. The ring oscillator 101 is configured to be capable of stop operating in response to a reset signal 115, as illustrated in FIG. 1.

The ring oscillators 102 and 103 configured to generate high-speed clocks 113 and 114 have the same configuration as that of the ring oscillator 101 and include five and seven inverters, respectively.

A high-speed clock selecting unit 104 is configured to receive the high-speed clocks 112, 113, and 114 output from the ring oscillators 101, 102, and 103 and high-speed clock selection signals 116, 117, and 118 and select a high-speed clock to be used for generating random numbers.

According to this embodiment, each of high-speed clocks and a high-speed clock selection signal are ANDed (e.g. passed, through an AND gate where the output only is true if both of two inputs is true), and the high-speed clock selection signal is changed to "L" for a clock not to be used for the random number generation so that the high-speed clock can be fixed to "L".

A three-input exclusive or (XOR) circuit (exclusive logical OR gate) 105 being a logic circuit is configured to receive high-speed clocks output from the high-speed clock selecting unit 104 and perform, a logical operation for output a value based on a truth table in FIG. 5.

Figure 6:
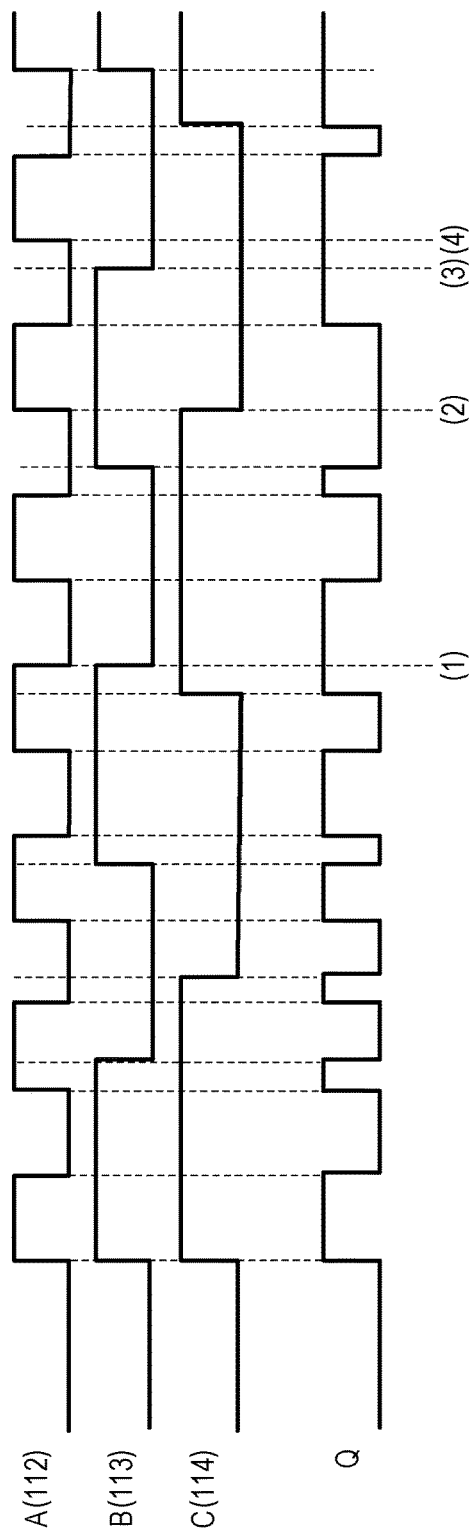
FIG. 6 is a property diagram illustrating waveforms of input/output signals to/from the three-input XOR circuit.

FIG. 6 is a property diagram illustrating waveforms of input/output signals to and from the three-input XOR circuit 105 illustrated in FIG. 1.

Referring to FIG. 6, a waveform A represents a waveform of the high-speed clock 112 to an input terminal A of the three-input XOR circuit 105. A waveform B represents a waveform, of the high-speed clock 113 to an input terminal B of the three-input XOR circuit 105. A waveform C represents a waveform of the high-speed clock 114 to an input terminal C of the three-input XOR circuit 105. A waveform Q represents a waveform of a signal output from an output terminal Q of the three-input XOR circuit 105.

A plurality of high-speed clocks having different phases and frequencies from each other is fed to the three-input XOR circuit 105 to increase the number of toggles of data in an data input terminal of a triggered FF 106 as illustrated in FIG. 6. This can increase the randomness in the random number generation. A high-speed clock being an output signal from the three-input XOR circuit 105 is input to a signal input terminal of the triggered FF 106. A reference clock is input to a reference clock terminal of the triggered FF 106.

A clock CLK_IN 119 containing large jitter at a sufficiently low speed is input as a clock input against high-speed clocks output from the ring oscillators 101, 102, and 103 for "H" and "L" output with high randomness.

A high-speed clock control unit 107 is configured to perform processing for selecting an output from the reset signal 115 for stopping operations of the ring oscillator 101 to 103, The high-speed clock control unit 107 outputs the high-speed clock selection signals 116, 117, and 118 for selecting a clock of the high-speed clocks to be used for the random number generation.

The high-speed clock control unit 107 internally contains a register circuit 108 for generating a reset signal and register circuits 109, 110, and 111 for generating high-speed clock selection signals, the details of which are not illustrated.

The output signals are controlled by an access from a CPU configured to control the random number generating apparatus 100.

The truth table illustrated in FIG. 5 is a truth table in a case where high-speed clocks input to the three-input XOR circuit 105 are all valid.

The waveform of the input signal to the three-input XOR circuit 105 and the waveform of the corresponding output signal correspond to the property diagram illustrated in FIG. 6.

The input high-speed clocks A, B, and C may be XORed (e.g. passed through an XOR gate) for signal toggling at a shorter cycles than that of the clock A which is toggling at the highest speed.

However, some frequencies of high-speed clocks, togging may not be performed on the output signal from the three-input XOR circuit 105 even when togging is performed on a high-speed clock, as illustrated in time points (1) to (4) in FIG. 6.

Some combinations of frequencies of high-speed clocks and some combinations with a frequency or jitter of a low-speed clock may change the randomness of the signals output from the triggered FF 106. Therefore, a maximum randomness may not be achieved by XORing all high-speed clocks.

Figure 7:
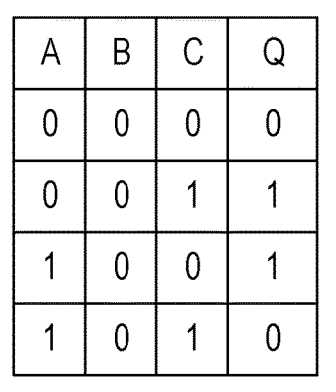

FIG. 7 is a truth table illustrating operations to be performed by the high-speed clock generating unit 100 illustrated in FIG. 1. The truth table is obtained in a case where the high-speed clock B of the high-speed clocks to be input to the three-input XOR circuit 105, that is, the high-speed clock 113 is fixed to "L" under control of the high-speed clock selection signal 117.

Figure 8:
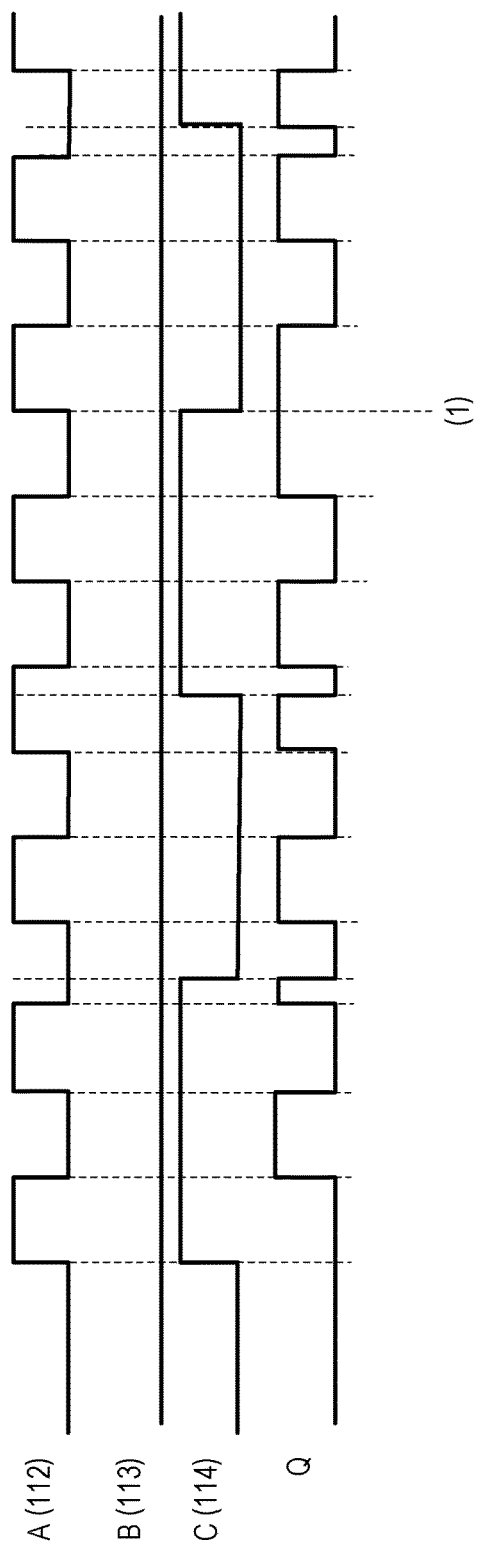
FIG. 8 is a property diagram illustrating waveforms of input/output signals.

The waveform of the input signal to the three-input XOR circuit 105 and the waveform of the corresponding output signal based on the truth table in FIG. 7 correspond to a property diagram illustrated in FIG. 8.

Input high-speed clocks A and C may be XORed to achieve signal toggling at a shorter cycle than that of the clock A being toggled at the highest speed. However, with some frequencies of high-speed clocks, the output signal from the three-input XOR circuit 105 may not be toggled even when the high-speed clock is toggled, as illustrated in a time point (1) in FIG. 8.

Some combinations of frequencies of high-speed clocks and some combinations with a frequency or jitter of a low-speed clock may change the randomness. Therefore, a maximum, randomness may not be achieved by XORing high-speed clocks.

Figure 9:
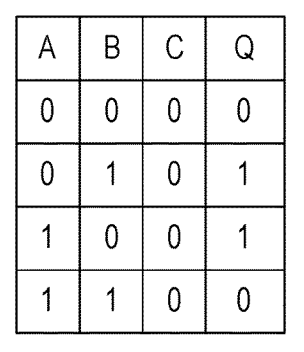

FIG. 9 is a truth table obtained in a case where the high-speed clock C of the high-speed clocks to be input to the three-input XOR circuit 105, that is, the high-speed clock 114 is fixed to "L" under control of the high-speed clock selection signal 118.

Figure 10:
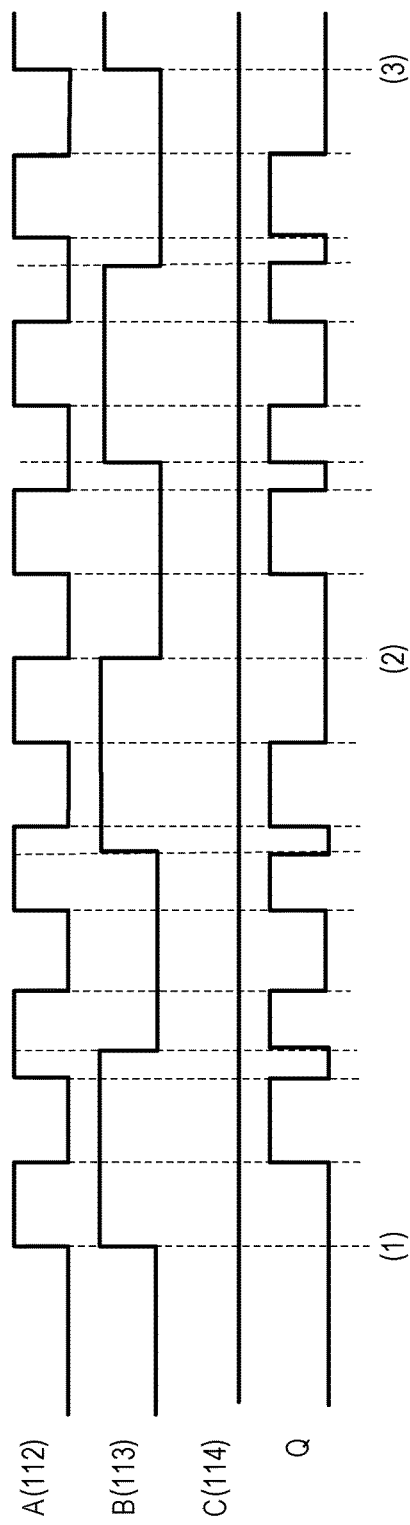
FIG. 10 is a property diagram illustrating operations to be performed by the three-input XOR circuit.

The waveform of the input signal to the three-input XOR circuit 105 and the waveform of the corresponding output, signal based, on the truth table in FIG. 9 correspond to a property diagram illustrated in FIG. 10.

Input high-speed clocks A and B may be XORed to achieve signal toggling at a shorter cycle than that of the clock A being toggled at the highest speed. However, with some frequencies of high-speed clocks, the output signal from the three-input XOR circuit 105 may not be toggled even when the high-speed clock is toggled, as illustrated in time points (1) to (3) in FIG. 10.

Some combinations of frequencies of high-speed clocks and some combinations with a frequency or jitter of a low-speed clock may change the randomness. Therefore, a maximum randomness may not be achieved by XORing high-speed clocks.

Figure 11:
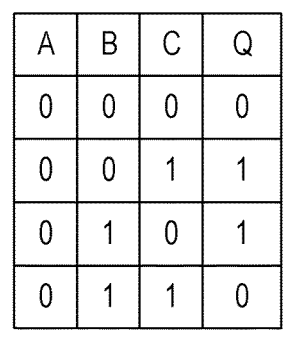

FIG. 11 is a truth table obtained in a case where the high-speed clock A of the high-speed clocks to be input to the three-input XOR circuit 105, that is, the high-speed clock 112 is fixed to "L" under control of the high-speed clock selection signal 116.

Figure 12:
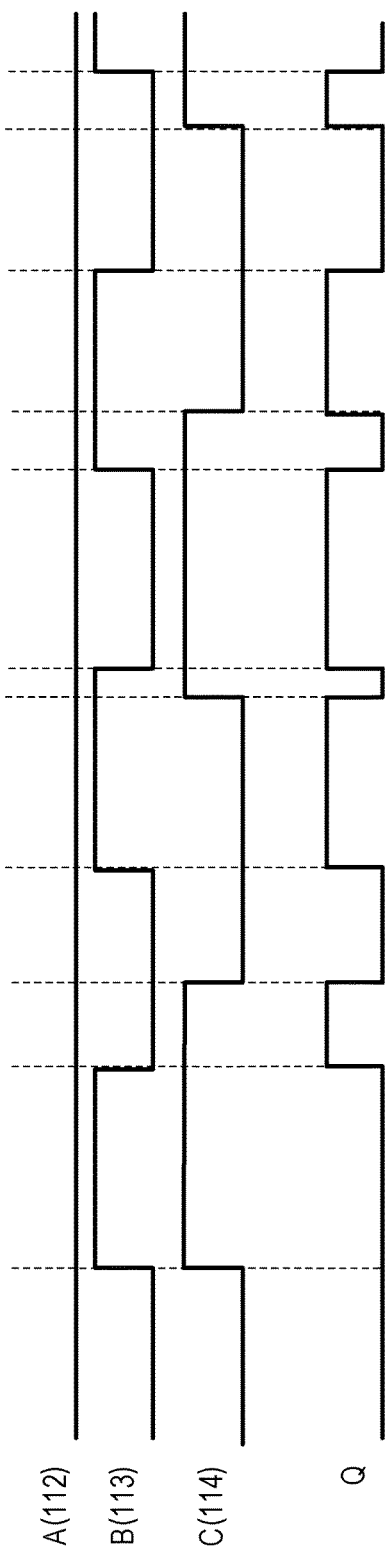
FIG. 12 is a property diagram illustrating operations to be performed by the three-input XOR circuit.

The waveform of the input signal to the three-input XOR circuit 105 and the waveform of the corresponding output signal based on the truth table in FIG. 11 correspond to a property diagram illustrated in FIG. 12.

Input high-speed clocks B and C may be XORed to reduce the number of toggles compared with the clock A being toggled at the highest speed.

However, the high-speed clocks B and C both have a lower frequency than that of the high-speed clock A. Therefore, inconsideration of increased jitter of the clocks when generated, some combinations with a frequency or jitter of a low-speed clock may change the randomness. Therefore, the randomness may increase.

Which of a case where all high-speed clocks are to be used and a case where one of clocks are stopped can produce output with the highest randomness depends on the combination of frequencies and jitter of high-speed clocks and frequencies and jitter of low-speed clocks and the voltage and temperature while the random number generating apparatus is operating, for example.

Therefore, the random number generating apparatus may be built in a product, and the settings from the high-speed clock control unit 107 may be changed variously in an environment approximate to a state that the product is being operated so that random numbers with the highest randomness and best fitted to the environment can be generated.

Various methods are available for determination of randomness, but this embodiment performs the determination in the following manner.

The combination of settings for the register circuits 109, 110, and 111 for high-speed clock selection signals may be changed for all of the combinations, and, for each of the settings, data for a certain number of cycles of low-speed clocks are obtained with respect to a signal output from the triggered FF 106.

The setting with which the number of "0" of the data is the closest to the half of the certain number of cycles is determined to achieve the highest randomness.

It is assumed here, for example, that data for 100000 cycles of low-speed clocks are obtained for the signal to be output from the triggered FF 106. Based on a setting to be used for XORing all high-speed clocks of the high-speed clocks 112, 113, and 114, 500200 "0s", 499800 "Hs" are obtained when data for 100000 cycles are obtained.

Based on a setting that the high-speed clock 112 is fixed to "L" and the high-speed clocks 113 and 114 are used for XORing, 500250 "0s" and 499750 "Hs" are obtained when data for 100000 cycles are obtained.

Based on a setting that the high-speed clock 113 is fixed to "L" and the high-speed clocks 112 and 114 are to be used for XORing, 500150 "0s" and 499850 "Hs" are obtained when data for 100000 cycles are obtained.

Based on a setting that the high-speed clock 114 is fixed to "L" and the high-speed clocks 112 and 113 are to be used for XORing, 500230 "0s" and 499770 "Hs" are obtained when data for 100000 cycles are obtained. In this case, the setting that the high-speed clock 113 is fixed to "L" and the high-speed clocks 112 and 114 are to be used for XORing is adopted as providing the highest randomness.

By building the random number generating apparatus in a product and determining a set value providing the highest randomness in an environment approximate to a state that the product is being operated, random numbers with the highest randomness can be generated when the product is in use.

Second Embodiment

According to the first embodiment, a random number generating apparatus which generates random numbers with high randomness is provided by changing the combination of high-speed clocks output from a plurality of ring oscillators having different delay times to be used for XORing or a signal to be input to the data input terminal (DI) of the triggered FF 106.

According to a second embodiment, a random number generating apparatus is provided which generates random number with high randomness by changing the low-speed clocks to be input to a clock input terminal (CLK) of the triggered FF 106.

Figure 13:
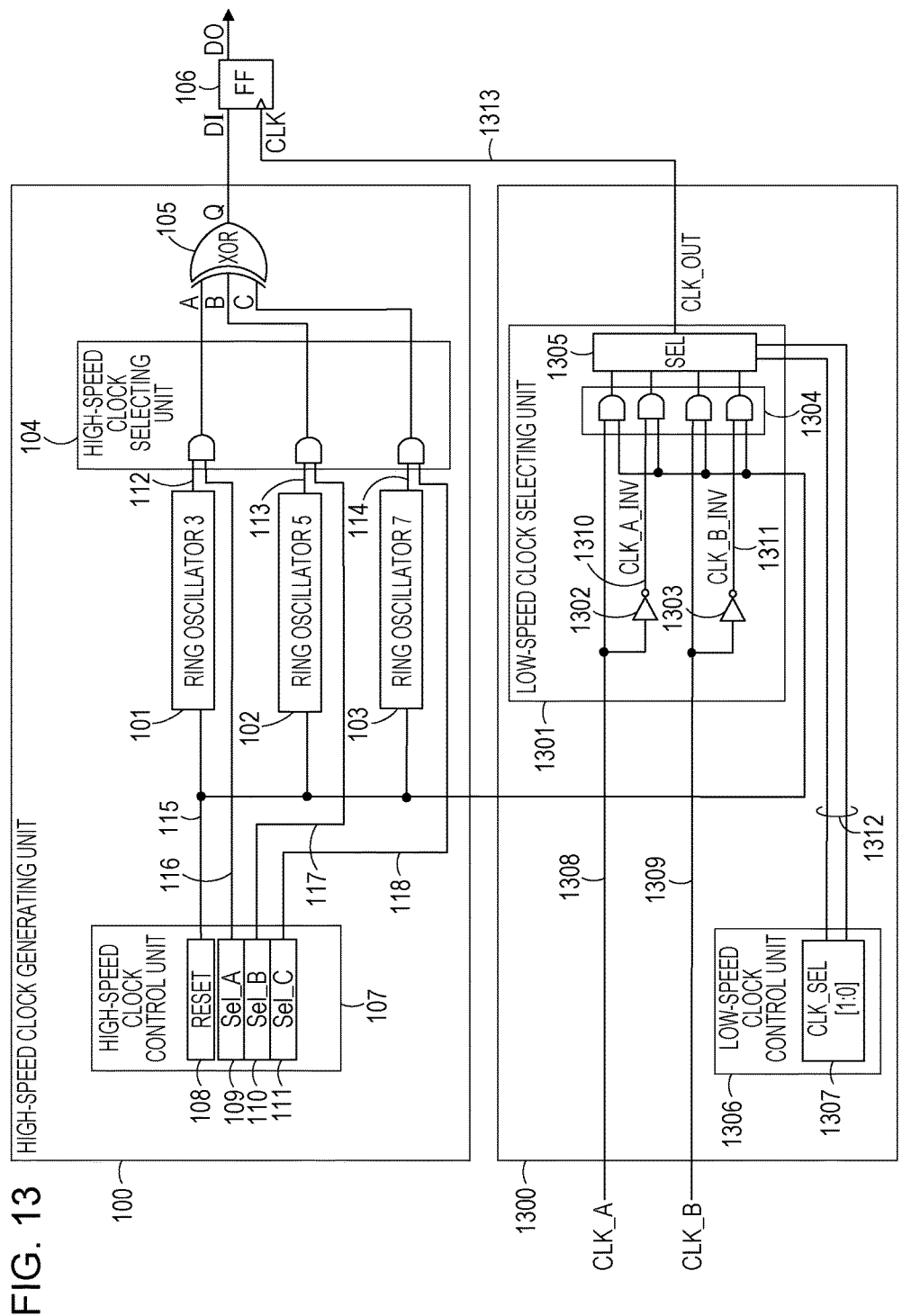
FIG. 13 is a block diagram illustrating a configuration of a random number generating apparatus.

FIG. 13 is a block diagram illustrating a configuration of the random, number generating apparatus according to this embodiment. This embodiment further includes a clock selecting unit configured to dynamically select an asynchronous reference clock, in addition to the first embodiment.

Because the high-speed clock generating unit 100 according to this embodiment has the same configuration as that of the first embodiment, like numbers refer to like parts between the first embodiment as illustrated in FIG. 1 and the second embodiment. Any repetitive detail descriptions will be omitted. Here, a low-speed clock generating unit 1300 according to the second embodiment will be described in detail.

Referring to FIG. 13, the low-speed clock generating unit 1300 includes a low-speed clock selecting unit 1301 and a low-speed clock, control unit 1306. Two types of low-speed clocks CLK_A and CLK_B having different frequencies from each other are input to the low-speed clock generating unit 1300.

An inverter within the low-speed clock selecting unit 1301 generates an inverted clock of each of input low-speed clocks. An inverted clock CLK_A_INV is generated from CLK_A by an inverter 1302.

An inverted clock CLK_B_INV is generated from CLK_B by an inverter 1303.

The two types of low-speed clocks CLK_A and CLK_B input to the low-speed clock selecting unit 1301 and inverted clocks CLK_A_INV and CLK_B_INV of the clocks and a reset signal are input to an AND gate by a clock stop control unit 1304 to stop togging when the reset signal has "L". The low-speed clocks output from the clock stopping unit 1304 are input to the selector 1305.

A selector 1305 selects and outputs one type of clock of the input low-speed clocks in response to a clock selection signal 1312 from, the low-speed clock control unit 1306. According to the second embodiment, the clock selection signal 1312 is a 2-bit signal as illustrated in FIG. 14.

When CLK_SEL[0] has "L" and CLK_SEL[1] has "L", CLK_A is output. When CLK_SEL[0] has "H" and CLK_SEL[1] has "L", CLK_A_INV is output.

When CLK_SEL[0] has "L", and CLK_SEL[1] has "H", CLK_B is output. When CLK_SEL[0] has "H" and CLK_SEL[1] has "H", CLK_B_INV is output.

The low-speed clock control unit 1306 internally contains a register circuit 1307 for generating the selection signal 1312 for a low-speed clock, the details of which are not illustrated, and controls the clock selection signal 1312 in response to an access from a CPU controlling the random number generating apparatus.

A low-speed clock selected and output by the low-speed clock control unit 1306 is input to the input clock terminal (CLK) of the triggered FF 106 in the manner described above.

Figure 15:
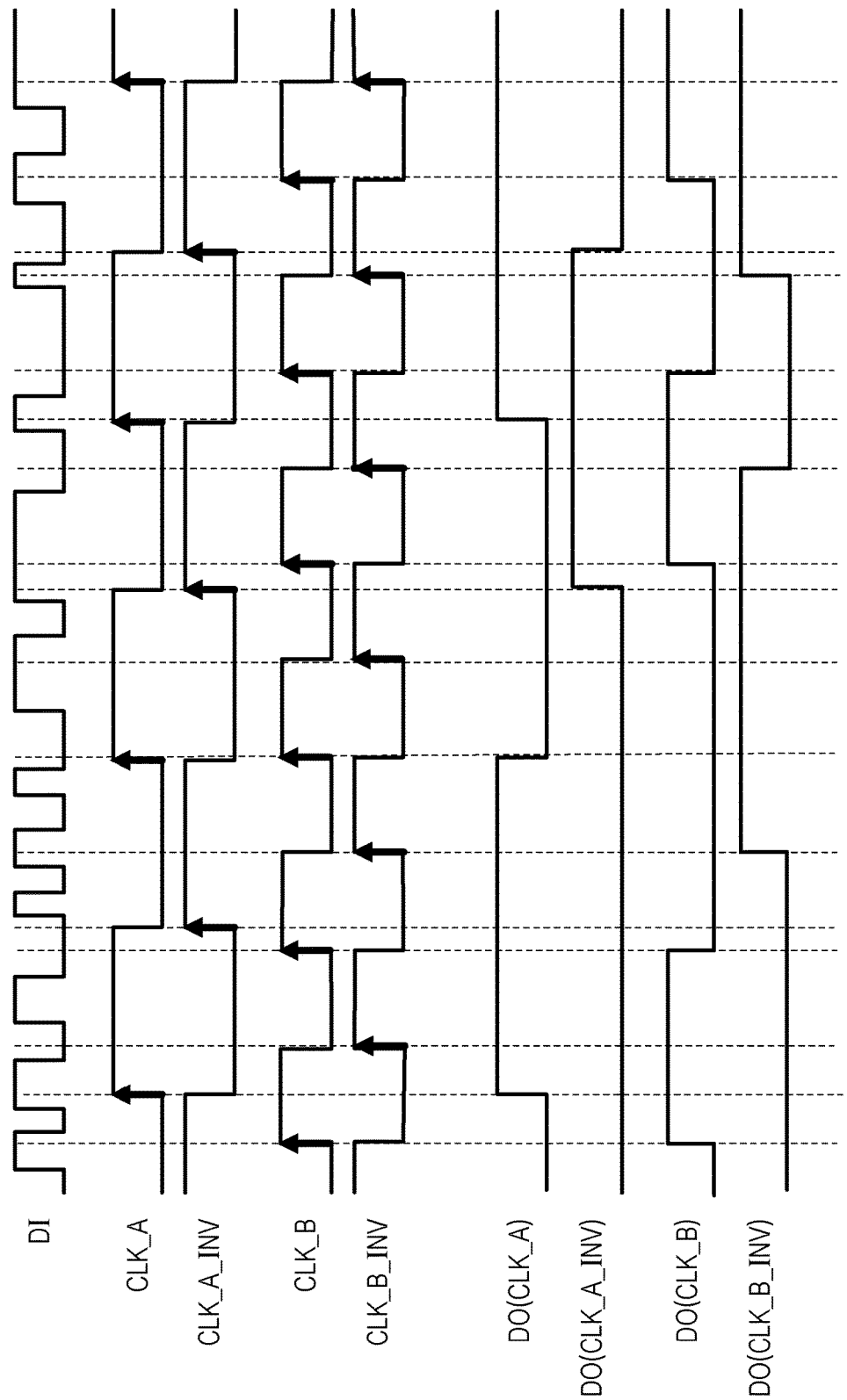
FIG. 15 is a property diagram illustrating operations to be performed by the circuit illustrated in FIG. 13.

FIG. 15 is a property diagram illustrating operations to be performed by the circuit illustrated in FIG. 13.

FIG. 15 exemplarily illustrates output signals from the triggered FF 106 in a case where each of an output signal from XORed signals input to an input data terminal (DI) of the triggered FF 106, the two types of low-speed clocks CLK_A and CLK_B input to the low-speed clock generating unit 1300, and inversed clocks CLK_A_INV and CLK_B_INV of the low-speed clocks CLK_A and CLK_B, respectively, is selected as an output clock.

A waveform DO(CLK_A) representing a transition of a signal at an output terminal of the triggered FF 106 when CLK_A. is selected as a clock for the triggered FF 106 is to be externally output.

A waveform DO(CLK_A_INV) represents a transition of a signal at the output terminal of the triggered FF 106 when CLK_A_INV is selected as a clock for the triggered FF 106.

A DO(CLK_B) waveform represents a transition of a signal at the output terminal of the triggered FF 106 when CLK_B is selected as a clock for the triggered FF 106. A waveform. DO (CLK_B_INV) represents a transition of a signal at the output terminal of the triggered FF 106 when CLK_B_INV is selected as a clock for the triggered FF 106.

As illustrated in FIG. 15, different random numbers are output depending on the frequencies, rising edges and falling edges of low-speed clocks output from the low-speed clock generating unit 1300. Because the size of jitter of each of the low-speed clocks varies among clocks, the combination of a selected low-speed clock and a change of toggling and difference in jitter of a high-speed clock may vary, which may result in high randomness.

According to the second embodiment, a random number generating apparatus is provided which changes the low-speed clock to be input to the clock input terminal (CLK) of the triggered FF 106 to generate random numbers with high randomness.

As illustrated in FIG. 13, selection of a high-speed clock and selection of a low-speed clock are both performed so that more combinations as described above can be tried.

Which combination of a high-speed clock and a low-speed clock can produce output with the highest randomness depends on the combination of frequencies and jitter of high-speed clocks and frequencies and jitter of low-speed clocks and the voltage and temperature while the random number generating apparatus is operating, for example.

Therefore, the random number generating apparatus may be built in a product, and the settings from the high-speed clock control unit 107 and the low-speed clock control unit 1306 may be changed variously in an environment approximate to a state that the product is being operated so that random numbers with the highest randomness and best fitted to the environment can be generated.

Third Embodiment

According to the first embodiment, a random number-generating apparatus which generates random numbers with high randomness is provided by XORing high-speed clocks output from ring oscillators having different numbers of inverters for signals input to a data input terminal of the triggered FF 106 and increasing the number of toggles.

According to a third embodiment, a random number generating apparatus is provided which generates random numbers having high randomness by XORing outputs from a plurality of ring oscillators having different frequencies and jitter with a combination of different drive abilities of inverters in the ring oscillators the number of which is equal to that of the ring oscillators according to the first embodiment.

Figure 16:
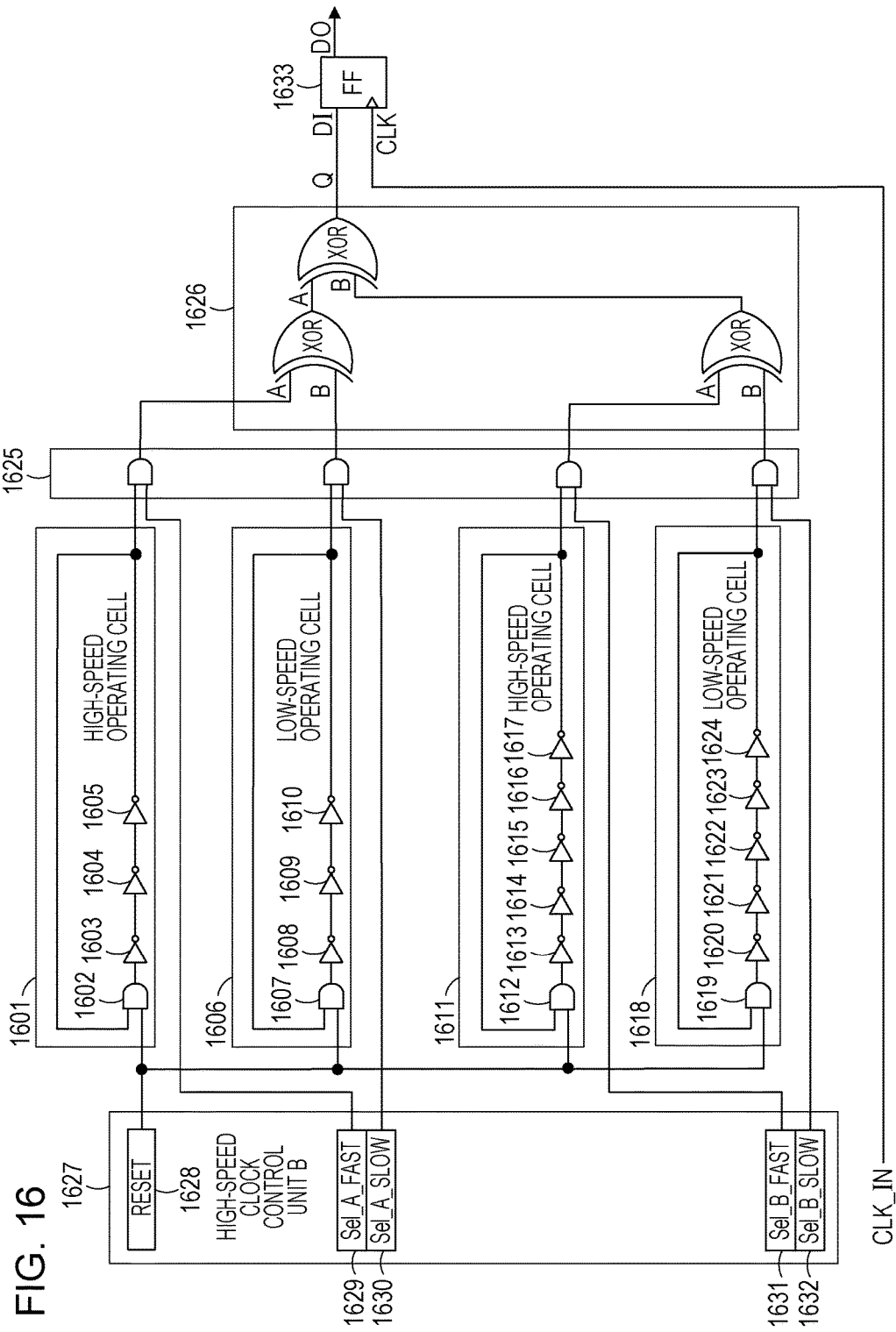
FIG. 16 is a block diagram illustrating a configuration of a random number generating apparatus.

FIG. 16 is a block diagram illustrating a configuration of a random, number generating apparatus according to this embodiment.

Referring to FIG. 16, a ring oscillator 1601 for generating high-speed clocks includes three inverters 1603, 1604, and 1605 capable of operating at a high speed or with a nigh drive capability. A ring oscillator 1601 for generating high-speed clocks can stop its operation for clock generation when a reset signal has "L" through an AND circuit 1602.

A ring oscillator 1606 for generating high-speed clocks includes three inverters 1608, 1609, and 1610 capable of operating at a low speed, that is, with a low drive capability according to this embodiment. The ring-oscillator 1606 for generating high-speed clocks can stop its operation for clock generation when a reset signal has "L" through an AND circuit 1607.

A ring oscillator 1611 for generating high-speed clocks includes five inverters 1613, 1614, 1615, 1616, and 1617 capable of operating at a high speed, that is, with a high drive capability according to this embodiment. The ring oscillator 1611 for generating high-speed clocks can stop its operation for clock generation when a reset signal has "L" through an AND circuit 1612.

A ring oscillator 1618 for generating high-speed clocks includes five inverters 1620, 1621, 1622, 1623, and 1624 capable of operating at a low speed, that is, with a low drive capability according to this embodiment. The ring oscillator 1618 for generating high-speed clocks can stop its operation for clock generation when a reset signal has "L" through an AND circuit 1619.

A high-speed clock control unit 1625 is configured to receive high-speed clocks output from the ring oscillators 1601, 1606, 1611, and 1618 and high-speed clock selection signals and control high-speed clocks to be used for random number generation.

According to this embodiment, each of high-speed clocks and a high-speed clock selection signal are ANDed, and a clock not to be used for random number generation is fixed to "L".

An XOR unit 1626 is configured to input a high-speed clock from the high-speed clock control unit 1625.

The XOR unit 1626 internally includes a two-step XOR, as illustrated in FIG. 16 and is configured to perform XOR processing on four inputs and output the resulting signal to the triggered FF 1633. A plurality of high-speed clocks is fed to the XOR circuit 1626 to increase the number of toggles of data in a data input terminal of the triggered FF 1633. This can increase the randomness in the random number generation.

The triggered FF 1633 receives an output signal from the data XOR circuit 1626 as data input, and a clock CLK_IN containing large jitter at a sufficiently low speed is input as a clock input against high-speed clocks output from the ring oscillators 1601, 1606, 1611, and 1618 for "H" and "L" output with high randomness.

A high-speed clock control unit B1627 is configured to output a reset signal for stopping operations of the ring oscillators and output a high-speed clock selection signal for selecting which clock is to be used for random number generation from high-speed clocks.

The high-speed clock control unit B1627 internally contains a register circuit 1628 for generating a reset signal and register circuits 1629, 1630, 1631, and 1632 for generating high-speed clock selection signals, the details of which are not illustrated.

The register circuit 1629 is configured to perform clock control over the ring oscillator 1601 containing three inverters capable of operating at a high speed. The register circuit 1630 is configured to perform clock control over the ring oscillator 1606 containing three inverters capable of operating at a low speed.

The register circuit 1631 is configured to perform clock control over the ring oscillator 1611 containing five inverters capable of operating at a high speed. The register circuit 1632 is configured to perform clock control over the ring oscillator 1618 containing five inverters capable of operating at a high speed. The registers within the high-speed clock control unit B1627 are configured to control output signals in response to an access from a CPU which controls the random number generating apparatus.

Figure 17:
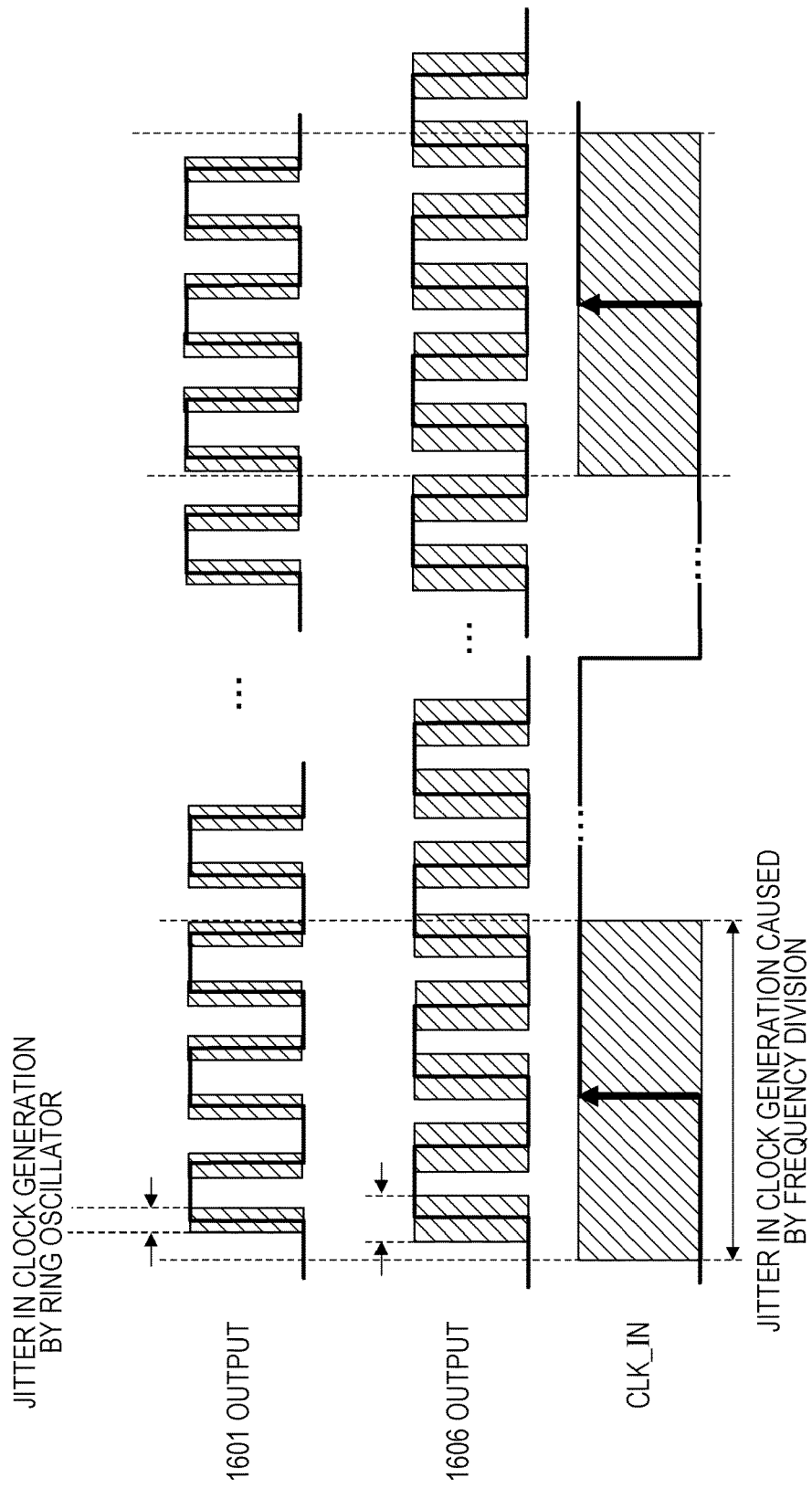
FIG. 17 is a property diagram illustrating operations to be performed by the random number generating apparatus illustrated in FIG. 16.

FIG. 17 is a property diagram illustrating operations to be performed by the random number generating apparatus illustrated in FIG. 16.

The property diagram illustrates differences in drive capability of inverter cells for output signals from, the ring oscillators and frequency and jitter of clocks.

Referring to FIG. 16, in a case where an inverter capable of operating at a high speed, that is, an inverter with a high drive capability is used, it takes a short time for a signal input from, the inverter 1603 to pass through the inverters 1603, 1604, and 1605. This increases the frequency of a clock to be output from the ring oscillator 1601.

This results in an increased number of toggles of a data signal to be input to the triggered FF 1633, which further increases the number of toggles within a jitter range of a low-speed clock and thus increases the randomness.

In the example illustrated in FIG. 17, the number of toggles within a jitter range of a low-speed clock CLK_IN includes 6 as the number of toggles from the ring oscillator 1601 and 5 as the number of toggles from the ring oscillator 1606. From a viewpoint of the number of toggles, the randomness from the ring oscillator 1601 may be increased.

In a case where an inverter capable of operating at a low speed, that is, an inverter with a low drive capability is used, it takes a long time for a signal input from the inverter 1608 to pass through the inverters 1608, 1609, and 1610. This lowers the frequency of a clock to be output from the ring oscillator 1606.

However, when the inverters operate at a low speed, the jitter occurring in the inverters is larger than that in inverters operating at a high speed. The jitter of a clock generated through a plurality of inverters operating at a low speed may increase.

This further increases jitter of a data signal to be input to the triggered FF, results in increased randomness in combination with jitter of the low-speed clock.

In the example illustrated in FIG. 17, the number of toggles within a jitter range of the low-speed clock CLK_IN includes a lower number of toggles from the ring oscillator 1606 than the number of toggles from the ring oscillator 1601, however, with increased jitter in toggling. The increased jitter in toggling means that a longer time is required for stabilizing the H/L state of the low-speed clock, resulting in higher randomness.

According to the third embodiment, in order to generate high-speed clocks to be input to the data input terminal of the triggered FF 106, the drive capabilities of the inverters included in the ring oscillator are differentiated to change the frequencies and the size of jitter.

Whether the randomness for random, number generation using a ring oscillator is higher with a higher number of toggles of high-speed clocks within a jitter range of low-speed clocks or the randomness with larger jitter of high-speed clocks is higher depends on combinations of frequencies and jitter of high-speed clocks and frequencies and jitter of low-speed clocks to be used for triggering.

In other words, it may depend on the temperature of a location where the random number generating apparatus is used or voltage when the random number generating apparatus is used, for example.

For that, an increase of the frequencies or an increase of the size of jitter may be set to be selectable as a property of a high-speed clock so that more combinations can be tried. As a result, the settings from the high-speed clock control unit B1627 can be changed variously in an environment approximate to a state that the random, number generating apparatus is actually operated so that, random numbers with the highest randomness fitted to the environment can be generated.

Fourth Embodiment

The random number generating apparatus according to the first embodiment may be configured to allow selection of low speed ring oscillators or high speed ring oscillators the number of which are equal but the operation capabilities of which are different so that the each of the low speed and high speed ring oscillators can function as different numbers of ring oscillators from each other.

From this, higher freedom can be expected in circuit adjustment for higher randomness.

Embodiments in the present disclosure may also be implemented by processing of reading and executing, by one or more processors in a computer in a system, or an apparatus, a program implementing one or more functions of the aforementioned embodiments and supplied to the system or the apparatus over a network or through a storage medium. An embodiment may further be implemented by a circuit (such as an ASIC) having one or more functions.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may include one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may .include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Application No. 2017-002512 filed Jan. 11, 2017, which is hereby incorporated by reference herein in its entirety.

What is claimed is:

1. A random number outputting apparatus comprising:
a first ring oscillator having a plurality of delay elements;
a second ring oscillator having a plurality of delay elements, wherein the number of delay elements in the first ring oscillator and the number of delay elements in the second ring oscillator are different;
a signal output circuit configured to receive at least a first signal output from the first ring oscillator and a second signal output from the second ring oscillator and to output the first signal and/or the second signal;
a register having a set value rewritable by access from a processor, wherein the signal output circuit outputs at least one signal selected from at least the first signal and the second signal based on the set value in the register;
a logic circuit configured to receive the at least one signal output by the signal output circuit and to output an output signal; and
a random signal output circuit configured to receive the output signal output from the logic circuit and a clock signal and to output a random signal.

2. The random number outputting apparatus according to claim 1, further comprising a third ring oscillator having a plurality of delay elements,
wherein the number of delay elements in the third ring oscillator is different from the number of delay elements in the first ring oscillator and is different from the number of delay elements in the second ring oscillator, and
wherein the signal output circuit is configured to receive a third signal output from the third ring oscillator and to output the first signal, the second signal, or the third signal.

3. The random number outputting apparatus according to claim 2,
wherein the logic circuit includes a first XOR element and a second XOR element,
wherein the first XOR element is configured to receive the first signal and the second signal and to output a fourth signal, and
wherein the second XOR element is configured to receive the fourth signal output from the first XOR element and the third signal and to output the output signal.

4. The random number outputting apparatus according to claim 1,
wherein the register is configured to output a first selection signal and a second selection signal,
wherein the signal output circuit includes a first logic circuit and a second logic circuit,
wherein the first logic circuit is configured to receive the first signal and the first selection signal and to output the first signal upon input of the first selection signal, and
wherein the second logic circuit is configured to receive the second signal and the second selection signal and to output the second signal upon input of the second selection signal.

5. The random number outputting apparatus according to claim 4, wherein the first logic circuit and the second logic circuit are AND elements.

6. The random number outputting apparatus according to claim 1, wherein the logic circuit includes an XOR element.

7. The random number outputting apparatus according to claim 1, wherein the random signal output circuit includes a flip-flop circuit and is configured to output, as the random signal, a state of the output signal when the clock signal changes its state.

8. The random number outputting apparatus according to claim 1, further comprising a reset signal output circuit configured to output a reset signal,
wherein, in a case where the reset signal is input, the reset signal is input to both the first ring oscillator and the second ring oscillator.

9. The random number outputting apparatus according to claim 1, wherein a frequency of the clock signal is lower than a frequency of the first signal and a frequency of the second signal.

10. The random number outputting apparatus according to claim 1, further comprising a clock signal output circuit configured to receive a plurality of clock signals having different frequencies from each other and to output a clock signal selected from the plurality of clock signals to the random signal output circuit.

11. The random number outputting apparatus according to claim 1, further comprising a clock signal output circuit configured to receive a plurality of clock signals having different frequencies from each other and to output a clock signal selected from the plurality of clock signals and inverted signals of the plurality of clock signals to the random signal output circuit.

12. A random number outputting apparatus comprising:
a first ring oscillator having a plurality of delay elements;
a second ring oscillator having a plurality of delay elements, wherein the number of delay elements in the first ring oscillator and the number of delay elements in the second ring oscillator are different;
a random signal output circuit configured to input at least a first signal output from the first ring oscillator, a second signal output from the second ring oscillator, and a clock signal and to output a random signal; and
a register having a set value rewritable by access from a processor, wherein at least one signal to be input to the random signal output circuit is selected from at least the first signal and the second signal based on the set value in the register.

13. The random number outputting apparatus according to claim 12, further comprising a third ring oscillator having a plurality of delay elements,
wherein the number of delay elements in the third ring oscillator is different from the number of delay elements in the first ring oscillator and is different from the number of delay elements in the second ring oscillator, and
wherein the random signal output circuit is configured to input a third signal output from the third ring oscillator and to output the random signal.

14. The random number outputting apparatus according to claim 13,
wherein the random signal output circuit includes a first XOR element and a second XOR element, wherein the first XOR element is configured to input the first signal and the second signal and to output a fourth signal, and wherein the second XOR element is configured to input the fourth signal output from the first XOR element and the third signal.

15. The random number outputting apparatus according to claim 12, further comprising:

a first logic circuit; and a second logic circuit, wherein the register outputs a first selection signal and a second selection signal based on the set value, wherein the first logic circuit is configured to receive the first signal and the first selection signal and to output the first signal upon input of the first selection signal, and wherein the second logic circuit is configured to receive the second signal and the second selection signal and to output the second signal upon input of the second selection signal.

16. The random number outputting apparatus according to claim 15, wherein the first logic circuit and the second logic circuit are AND elements.

17. The random number outputting apparatus according to claim 12, wherein the random signal output circuit includes an XOR element.

18. The random number outputting apparatus according to claim 12, wherein the random signal output circuit includes a flip-flop circuit.

19. The random number outputting apparatus according to claim 12, further comprising a reset signal output circuit configured to output a reset signal, wherein, in a case where the reset signal is input, the reset signal is input to both the first ring oscillator and the second ring oscillator.

20. The random number outputting apparatus according to claim 12, wherein a frequency of the clock signal is lower than a frequency of the first signal and a frequency of the second signal.

21. The random number outputting apparatus according to claim 12, further comprising a clock signal output circuit configured to receive a plurality of clock signals having different frequencies from each other and to output a clock signal selected from the plurality of clock signals to the random signal output circuit.

22. The random number outputting apparatus according to claim 12, further comprising a clock signal output circuit configured to receive a plurality of clock signals having different frequencies from each other and to output a clock signal selected from the plurality of clock signals and inverted signals of the plurality of clock signals to the random signal output circuit.

* * * * *